United States Patent
Endres et al.

(10) Patent No.: US 12,399,236 B2
(45) Date of Patent: Aug. 26, 2025

(54) INDUCING MECHANICAL STRESS IN MAGNETORESISTIVE SENSING ELEMENT TO ALIGN MAGNETIZATION AXIS OF REFERENCE LAYER SYSTEM IN PREFERRED DIRECTION FOR IMPROVED SENSOR PERFORMANCE

(71) Applicant: Infineon Technologies AG, Neubiberg (DE)

(72) Inventors: Bernhard Endres, Nabburg (DE); Jürgen Förster, Tegernheim (DE); Andreas Straßer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 191 days.

(21) Appl. No.: 18/194,749

(22) Filed: Apr. 3, 2023

(65) Prior Publication Data
US 2024/0329166 A1   Oct. 3, 2024

(51) Int. Cl.
*G01R 33/09*   (2006.01)
*H10N 50/10*   (2023.01)

(52) U.S. Cl.
CPC ......... *G01R 33/093* (2013.01); *G01R 33/091* (2013.01); *H10N 50/10* (2023.02)

(58) Field of Classification Search
CPC .............................. G01R 33/091; G01R 33/093
See application file for complete search history.

(56) References Cited

U.S. PATENT DOCUMENTS

| | | | | |
|---|---|---|---|---|
| 2001/0010615 | A1* | 8/2001 | Yazawa | G11B 5/3903 29/603.16 |
| 2008/0032423 | A1* | 2/2008 | Wang | G01N 27/745 436/536 |
| 2013/0141091 | A1* | 6/2013 | Delaet | G01R 33/095 324/252 |

* cited by examiner

*Primary Examiner* — Alesa Allgood
(74) *Attorney, Agent, or Firm* — Harrity & Harrity, LLP

(57) ABSTRACT

A magnetoresistive sensor includes a sensing element and a stress inducing layer. The sensing element has a layer stack that includes a reference layer having a fixed reference magnetization aligned with a magnetization axis; a magnetic free layer having a magnetically free magnetization, wherein the magnetically free magnetization is variable in a presence of an external magnetic field; and a non-magnetic layer arranged between the reference layer and the magnetic free layer. The stress inducing layer is coupled to the layer stack and is configured to apply a force to the layer stack to induce a mechanical stress in the layer stack along a mechanical stress axis such that the magnetization axis is aligned parallel with the mechanical stress axis or perpendicular with the mechanical stress axis.

28 Claims, 8 Drawing Sheets

INDUCING MECHANICAL STRESS IN MAGNETORESISTIVE SENSING ELEMENT TO ALIGN MAGNETIZATION AXIS OF REFERENCE LAYER SYSTEM IN PREFERRED DIRECTION FOR IMPROVED SENSOR PERFORMANCE

BACKGROUND

Magnetic field sensors based on a magnetoresistance effect are referred to as magnetoresistive sensors and are often used in magnetic field sensing applications, such as current sensing, position sensing, and angle sensing. Magnetoresistance is a property of a material to change a value of the material's electrical resistance when an external magnetic field is applied to the material. On account of magnetoresistive sensors' high signal level and high accuracy, and the possibility to integrate magnetoresistive sensors into complementary metal-oxide-semiconductor (CMOS) and bipolar-CMOS (BiCMOS) technologies, magnetoresistive sensors may be a preferred choice over Hall-based sensors. Some types of magnetoresistive sensors include anisotropic magnetoresistance (AMR) sensors, giant magnetoresistance (GMR) sensors, and tunnel magnetoresistance (TMR) sensors, each of which utilizes a corresponding magnetoresistive effect.

The large number of different magnetoresistive effects is often abbreviated to xMR, where the "x" serves as a placeholder for the different magnetoresistive effects. xMR sensors can detect the orientation of an applied magnetic field by measuring sine and cosine angle components using monolithically integrated magnetoresistive sensing elements. Here, the acronym respectively of the xMR sensor denotes the magnetoresistive effect used for measuring a respective magnetic field. In this regard, a GMR effect is a quantum mechanical magnetoresistance effect that is observed in thin-film structures comprising of alternating ferromagnetic and non-magnetic conductive layers. A TMR effect occurs in a magnetic tunnel junction (MTJ), wherein the magnetic tunnel junction occurs at a thin insulator that separates two ferromagnets from one another. An AMR effect is a property of a material in which a dependence of the electrical resistance on an angle between a direction of an electric current (e.g., a sensing axis) and a magnetization direction is observed. The magnetoresistive effect may be related to a sensitivity of an xMR sensor. For example, the magnetoresistive effect may be increased in order to increase the sensitivity of the xMR sensor.

SUMMARY

In some implementations, a magnetoresistive sensor includes a sensing element having a layer stack, the layer stack comprising: a reference layer having a fixed reference magnetization aligned with a magnetization axis; a magnetic free layer having a magnetically free magnetization, wherein the magnetically free magnetization is variable in a presence of an external magnetic field; and a non-magnetic layer arranged between the reference layer and the magnetic free layer; and a stress inducing layer coupled to the layer stack, wherein the stress inducing layer is configured to apply a force to the layer stack to induce a mechanical stress in the layer stack along a mechanical stress axis such that the magnetization axis is aligned parallel with the mechanical stress axis or perpendicular with the mechanical stress axis.

In some implementations, a magnetoresistive sensor includes a first sensing element having a first layer stack, the first layer stack comprising: a first reference layer having a first fixed reference magnetization aligned with a first magnetization axis; a first magnetic free layer having a first magnetically free magnetization, wherein the first magnetically free magnetization is variable in a presence of an external magnetic field; and a first non-magnetic layer arranged between the first reference layer and the first magnetic free layer; a second sensing element having a second layer stack, the second layer stack comprising: a second reference layer having a second fixed reference magnetization aligned with a second magnetization axis; a second magnetic free layer having a second magnetically free magnetization, wherein the second magnetically free magnetization is variable in a presence of the external magnetic field; and a second non-magnetic layer arranged between the second reference layer and the second magnetic free layer; and a stress inducing layer coupled to the first layer stack and the second layer stack, wherein the stress inducing layer is configured to apply a first force to the first layer stack to induce a first mechanical stress in the first layer stack along a first mechanical stress axis such that the first magnetization axis is aligned parallel with the first mechanical stress axis or perpendicular with the first mechanical stress axis, and apply a second force to the second layer stack to induce a second mechanical stress in the second layer stack along a second mechanical stress axis such that the second magnetization axis is aligned parallel with the second mechanical stress axis or perpendicular with the second mechanical stress axis.

In some implementations, a magnetoresistive sensor includes a sensing element having a layer stack stacked in a vertical dimension, the layer stack comprising: a reference layer having a fixed reference magnetization aligned with a magnetization axis; a magnetic free layer having a magnetically free magnetization, wherein the magnetically free magnetization is variable in a presence of an external magnetic field; and a non-magnetic layer arranged between the reference layer and the magnetic free layer; and a conductive layer coupled to a top or a bottom of the layer stack, wherein the conductive layer has a first outer periphery that defines lateral edges of the conductive layer, wherein the layer stack has a second outer periphery that defines lateral edges of the layer stack, wherein a minimum distance between the first outer periphery and the second outer periphery is greater than 1 micrometer (μm).

BRIEF DESCRIPTION OF THE DRAWINGS

Implementations are described herein with reference to the appended drawings.

DETAILED DESCRIPTION

Figure 1:
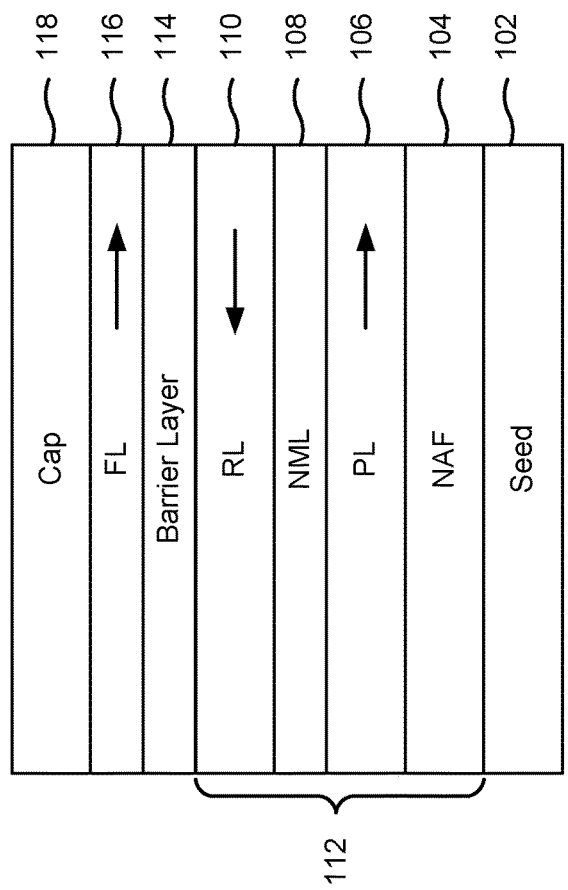
FIG. 1 shows an example of a layer stack of a magnetoresistive sensing element according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view rather than in detail in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "top," "bottom," "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling, e.g., any connection or coupling without additional intervening elements, may also be implemented by an indirect connection or coupling, e.g., a connection or coupling with one or more additional intervening elements, or vice versa, as long as the general purpose of the connection or coupling, for example, to transmit a certain kind of signal or to transmit a certain kind of information, is essentially maintained. Features from different implementations may be combined to form further implementations. For example, variations or modifications described with respect to one of the implementations may also be applicable to other implementations unless noted to the contrary.

As used herein, the terms "substantially" and "approximately" mean "within reasonable tolerances of manufacturing and measurement." For example, the terms "substantially" and "approximately" may be used herein to account for small manufacturing tolerances or other factors (e.g., within 5%) that are deemed acceptable in the industry without departing from the aspects of the implementations described herein. For example, a resistor with an approximate resistance value may practically have a resistance within 5% of the approximate resistance value. As another example, an approximate signal value may practically have a signal value within 5% of the approximate signal value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

"Sensor" may refer to a component which converts a property to be measured to an electric signal (e.g., a current signal or a voltage signal). The property to be measured may, for example, comprise a magnetic field, an electric field, an electromagnetic wave (e.g., a radio wave), a pressure, a force, a current, or a voltage, but is not limited thereto. For instance, it will be appreciated that there are various sensor techniques for measuring a current flowing through a conductor or a position (e.g., linear position, rotational position, or angular position) of an object in connection with a magnetic field.

A TMR-based sensing element, which includes a layer stack of ferromagnetic and non-magnetic layers, may be exposed to mechanical stress during fabrication or during integration in a sensor package. The mechanical stress may cause changes of the magnetic properties of the layer stack due to an inverse magnetostrictive effect. For example, the mechanical stress may cause a reference magnetization of the layer stack to deviate from an intended orientation or direction. As a result, the changes of the magnetic properties of the layer stack may lead to increase sensing errors (e.g., increased angle errors), a weaker reference layer system which can lead to a lower TMR effect and lower sensitivity, and/or a faster degradation of the sensing element which can lead to a reduced lifetime of the sensing element.

Accordingly, some implementations disclosed herein are directed to a magnetoresistive sensor that makes use of the inverse magnetostrictive effect by layout and integration to tune a sensor performance of the sensing element (e.g., a TMR sensing element). For example, a stress inducing layer may be coupled to a layer stack of the sensing element. The stress inducing layer may be configured to apply a force to the layer stack to induce a mechanical stress in the layer stack along a mechanical stress axis such that a magnetization axis of a reference layer system of the sensing element is aligned in a desired direction. For example, the magnetization axis of the reference layer system may be aligned parallel with the mechanical stress axis or perpendicular with the mechanical stress axis. As a result, an orientation of the magnetization axis may be tuned to reduce sensing errors, strengthen the reference layer system to increase the TMR effect and sensitivity, and increase the lifetime of the sensing element. An increase in sensitivity leads to higher signal amplitudes, which are easier to process.

For example, magnetic materials used in TMR layer stacks typically have a positive magnetostriction constant. In other words, the magnetic properties of the magnetic materials prefer to align along a tensile stress axis. This effect can be used to stabilize the reference layer system. By coupling the stress inducing layer (e.g., a stress inducing liner or film) to the layer stack, a stabilization effect can be achieved depending on a metallization layout of the magnetoresistive sensor. The stabilization effect can be used to hold the magnetization axis of the reference layer system in a desired orientation. In addition, in some implementations, the TMR effect can be increased by 20%. Moreover, due to a more stable reference layer system, less degradation is observed, which can lead to less offset and an increased lifetime of the layer stack. In addition, by adapting the layout to the reference system magnetization, an increased amplitude in angular sensors can be achieved for both x- and y-magnetized sensing elements, which causes lower angular errors.

FIG. 1 shows an example of a layer stack of a magnetoresistive sensing element 100 according to one or more implementations. For example, the magnetoresistive sensing element 100 may be a TMR sensing element with a bottom-pinned spin-valve (BSV) configuration. Additionally, the magnetoresistive sensing element 100 can be arranged on a semiconductor substrate (not shown) of a magnetoresistive sensor. If described in a Cartesian coordinate system with pair-wise perpendicular coordinate axes x, y, and z, layers of the layer stack extend laterally in a plane spanned by the x and y axes. Thus, lateral dimensions (e.g., lateral distances, lateral cross-sectional areas, lateral areas, lateral extensions, lateral displacements, etc.) may refer to dimensions in the xy-plane and vertical dimensions may refer to dimensions in a z-direction, perpendicular to the xy-plane. For example, a vertical extent of a layer in the z-direction may be described as a layer thickness.

The layer stack of the magnetoresistive sensing element 100 includes at least one reference layer with a reference magnetization (e.g., a reference direction in the case of GMR or TMR technology). The reference magnetization is a magnetization direction that provides a sensing direction corresponding to a sensing axis of the magnetoresistive sensing element 100. The reference layer, and consequently the reference magnetization, defines a sensor plane. For example, the sensor plane may be defined by the xy-plane. Thus, the x-direction and the y-direction may be referred to as "in-plane" with respect to the sensor plane and the z-direction may be referred to as "out-of-plane" with respect to the sensor plane.

Accordingly, in the case of a GMR sensing element or a TMR sensing element, if a magnetically free magnetization of a magnetic free layer points exactly in a same direction as the reference magnetization (e.g., the reference direction), a resistance of the magnetoresistive sensing element 100 is at a minimum and, if the magnetically free magnetization of the magnetic free layer points exactly in an opposite direction as the reference magnetization, the resistance of the magnetoresistive sensing element 100 is at a maximum. An orientation of the magnetically free magnetization of the magnetic free layer is variable in a presence of an external magnetic field. Thus, the resistance of the magnetoresistive sensing element 100 can vary based on an influence of the external magnetic field on the magnetically free magnetization of the magnetic free layer.

From the bottom up, the magnetoresistive sensing element 100 may comprise an optional seed layer 102 that may be used to influence and/or optimize a stack growth. In some implementations, the seed layer 102 may be copper, tantalum, ruthenium, or a combination thereof. A natural antiferromagnetic (NAF) layer 104 is formed or otherwise disposed on the seed layer 102. The NAF layer 104 may be made of platinum-manganese (PtMn), iridium-manganese (IrMn), nickel-manganese (NiMn), or the like. A film thickness of the NAF can be in the range of 5 nm to 50 nm.

In addition, a pinned layer (PL) 106 may be formed or otherwise disposed on the NAF layer 104. The pinned layer 106 may be made of a ferromagnetic material, such as cobalt-iron (CoFe) or cobalt-iron-boron (CoFcB). Contact between the NAF layer 104 and the pinned layer 106 can provoke an effect known as an exchange bias effect, causing a magnetization of the pinned layer 106 to align in a preferred direction (e.g., in the x-direction, as shown). The magnetization of the pinned layer 106 may be referred to as a pinned magnetization. The pinned layer 106 can comprise a closed flux magnetization pattern in the xy-plane. This closed flux magnetization pattern of the pinned layer 106 may be generated during manufacturing of the magnetoresistive sensing element 100 and may be permanently fixed. Alternatively, the pinned layer 106 can comprise a linear magnetization pattern in the xy-plane (e.g., a homogenous orientation in one direction) that is permanently fixed.

The magnetoresistive sensing element 100 further comprises a non-magnetic layer (NML) referred to as coupling interlayer 108. The coupling interlayer 108 may be diamagnetic and may comprise ruthenium, iridium, copper, copper alloys, or similar materials, for example. A magnetic (e.g., ferromagnetic) reference layer (RL) 110 may be formed or otherwise disposed on the coupling interlayer 108. Thicknesses of the pinned layer 106 and the magnetic reference layer 110, respectively, may be in the range of 1 nm to 10 nm.

Accordingly, the coupling interlayer 108 may be arranged between the pinned layer 106 and the magnetic reference layer 110 in order to spatially separate the pinned layer 106 and the magnetic reference layer 110 in the vertical direction. In addition, the coupling interlayer 108 may provide an interlayer exchange coupling (e.g., an antiferromagnetic Ruderman-Kittel-Kasuya-Yosida (RKKY) coupling) between the pinned layer 106 and the magnetic reference layer 110 to form an artificial antiferromagnet. As a result, a magnetization of the magnetic reference layer 110 may align and be held in a direction anti-parallel or opposite to the magnetization of the pinned layer 106 (e.g., in the −x-direction, as shown). The magnetization of the magnetic reference layer 110 may be referred to as a reference magnetization.

Since the NAF layer 104 is configured to cause the magnetization of the pinned layer 106 to align and be fixed in a certain direction, and the coupling interlayer 108 is configured to cause the magnetization of the magnetic reference layer 110 to align and be fixed in an opposite direction, it can be said that the NAF layer 104 is configured to hold the magnetization of the pinned layer 106 (e.g., a fixed pinned magnetization) in a first magnetic orientation and hold the magnetization of the magnetic reference layer 110 (e.g., a fixed reference magnetization) in a second magnetic orientation. For example, if the pinned layer 106 comprises a clockwise closed flux magnetization pattern in the xy-plane, the magnetic reference layer 110 may comprise a counterclockwise closed flux magnetization pattern in the xy-plane (or vice versa). In this way, the magnetic reference layer 110 can have a permanent closed flux magnetization pattern. Moreover, in case the pinned layer 106 comprises a linear magnetization pattern in the xy-plane in a certain direction, the magnetic reference layer 110 may comprise a linear magnetization pattern in an anti-parallel direction. Thus, the NAF layer 104, the pinned layer 106, the coupling interlayer 108, and the magnetic reference layer 110 form a magnetic reference layer system 112 of the magnetoresistive sensing element 100.

The magnetoresistive sensing element 100 additionally comprises a barrier layer 114 (e.g., a tunnel barrier layer) arranged vertically between the reference layer system 112 and a magnetic free layer 116. For example, the barrier layer 114 may be formed or otherwise disposed on the magnetic reference layer 110 of the reference layer system 112, and the magnetic free layer 116 may be formed or otherwise disposed on the barrier layer 114.

The barrier layer 114 may be composed of a non-magnetic material. In some implementations, the barrier layer 114 may be an electrically insulating tunnel barrier layer. For example, the barrier layer 114 may be a tunnel barrier layer used for producing a TMR effect. The barrier layer 114 may comprise magnesium oxide (MgO) or another material with similar properties.

A material of the magnetic free layer 116 can be an alloy of a ferromagnetic material, such as CoFe, CoFeB, or NiFe. The magnetic free layer 116 has a magnetically free magnetization that is variable in a presence of an external magnetic field. Therefore, the magnetic free layer 116 may be referred to as a sensor layer, since changes in the magnetically free magnetization are used to determine a measured variable. In addition, the magnetically free magnetization has a default magnetic orientation in a ground state. The ground state is a state in which an influence of the external magnetic field on the magnetic free layer 116 is absent or negligibly small. In some implementations, the magnetoresistive sensing element 100 may include a magnetically free system that includes a plurality of layers (e.g., two or more magnetic free layers), which act in combination as the magnetically free layer. In this case, the magnetically free layers of the magnetically free system are magnetically coupled to each other. Thus, the magnetically free system can act as the magnetically free layer, but may comprise a plurality of layers. The magnetically free system has a magnetically free magnetization, wherein the magnetically free magnetization is variable in the presence of the external magnetic field.

A cap layer 118 made of, for example, tantalum (Ta), tantalum-nitride (TaN), ruthenium (Ru), titanium (Ti), titanium nitride (TiN), platinum (Pt), or the like, may be formed or otherwise disposed on the magnetic free layer 116 to form an upper layer of the magnetoresistive sensing element 100.

The seed layer 102 may serve as a bottom electrode or may provide electrical contact with a bottom electrode (not shown) of the magnetoresistive sensing element 100. The cap layer 118 may provide electrical contact with a top electrode (not shown) of the magnetoresistive sensing element 100. The barrier layer 114 may be designed to permit electrons to tunnel between the reference layer system 112 and the magnetic free layer 116 when a bias voltage is applied to electrodes of the magnetoresistive sensing element 100 (not shown) in order to provide a magnetoresistance effect (e.g., a TMR effect).

As indicated above, FIG. 1 is provided merely as an example. Other examples may differ from what is described with regard to FIG. 1. The number and arrangement of components shown in FIG. 1 are provided as an example. In practice, the magnetoresistive sensing element 100 may include additional elements, fewer elements, different elements, or differently arranged elements than those shown in FIG. 1.

Figure 2:
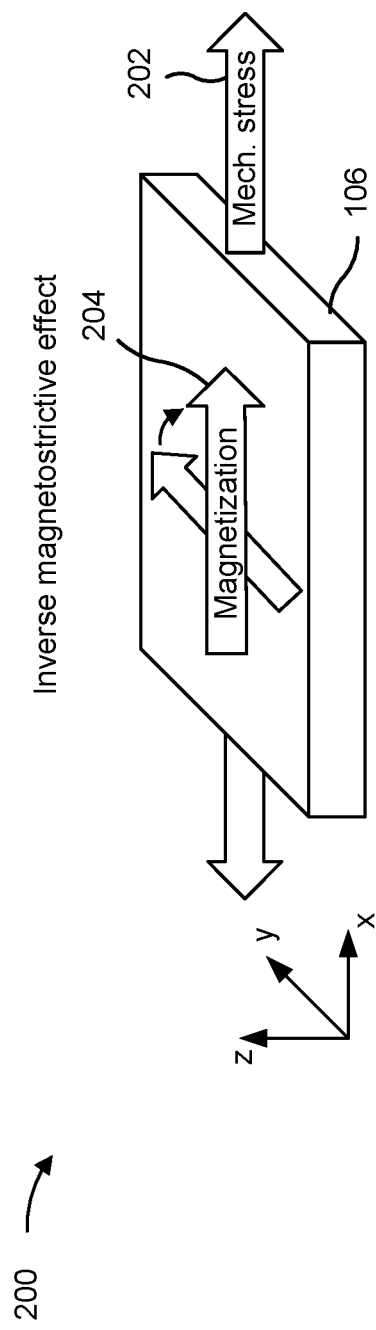
FIG. 2 shows a diagram of an inverse magnetostrictive effect according to one or more implementations.

FIG. 2 shows a diagram 200 of an inverse magnetostrictive effect according to one or more implementations. For example, the diagram 200 shows the inverse magnetostrictive effect for the pinned layer 106. A force may be applied to the pinned layer 106, which induces a mechanical stress in the pinned layer 106 along a mechanical stress axis 202. The force may be a compression force or a decompression force that causes the pinned layer 106 to deform in a dimension that is parallel with the mechanical stress axis 202. For a positive magnetostriction constant, a magnetization tends to align along with a tensile stress. In this example, the induced mechanical stress causes a magnetization axis 204 of the pinned layer 106 to shift in order to align parallel with the mechanical stress axis 202. As a result, the pinned magnetization of the pinned layer 106, which is aligned with the magnetization axis 204, is aligned parallel with the mechanical stress axis 202. Thus, by controlling a manner in which the force is applied to the pinned layer 106 and the direction of the induced mechanical stress, an orientation of the magnetization axis 204 can be controlled to align in a desired direction without an orientation error.

Moreover, since the reference magnetization of the magnetic reference layer 110 is coupled anti-parallel to the pinned magnetization by the coupling interlayer 108, the orientation of the reference magnetization is also aligned with the mechanical stress axis 202. In other words, the reference magnetization is aligned parallel with or anti-parallel with the mechanical stress axis 202. Furthermore, since the force is applied to the entire layer stack of a sensing element, the mechanical stress may be induced in each layer of the layer stack. Thus, the reference magnetization of the magnetic reference layer 110 may also be aligned with the mechanical stress axis 202 as a result of the mechanical stress induced within the magnetic reference layer 110.

In some implementations, the magnetization axis 204 may be oriented in a different direction relative to the mechanical stress axis 202. For example, the magnetization axis 204 may be oriented perpendicular to the mechanical stress axis 202. The orientation of the magnetization axis 204 relative to the mechanical stress axis 202 may depend on the material of the pinned layer 106 and the magnetic reference layer 110 (e.g., the magnetostriction constant). The mechanical stress axis 202 may be controlled according to the magnetostriction constant in order to control the orientation of the magnetization axis 204.

As indicated above, FIG. 2 is provided merely as an example. Other examples may differ from what is described with regard to FIG. 2.

Figure 3:
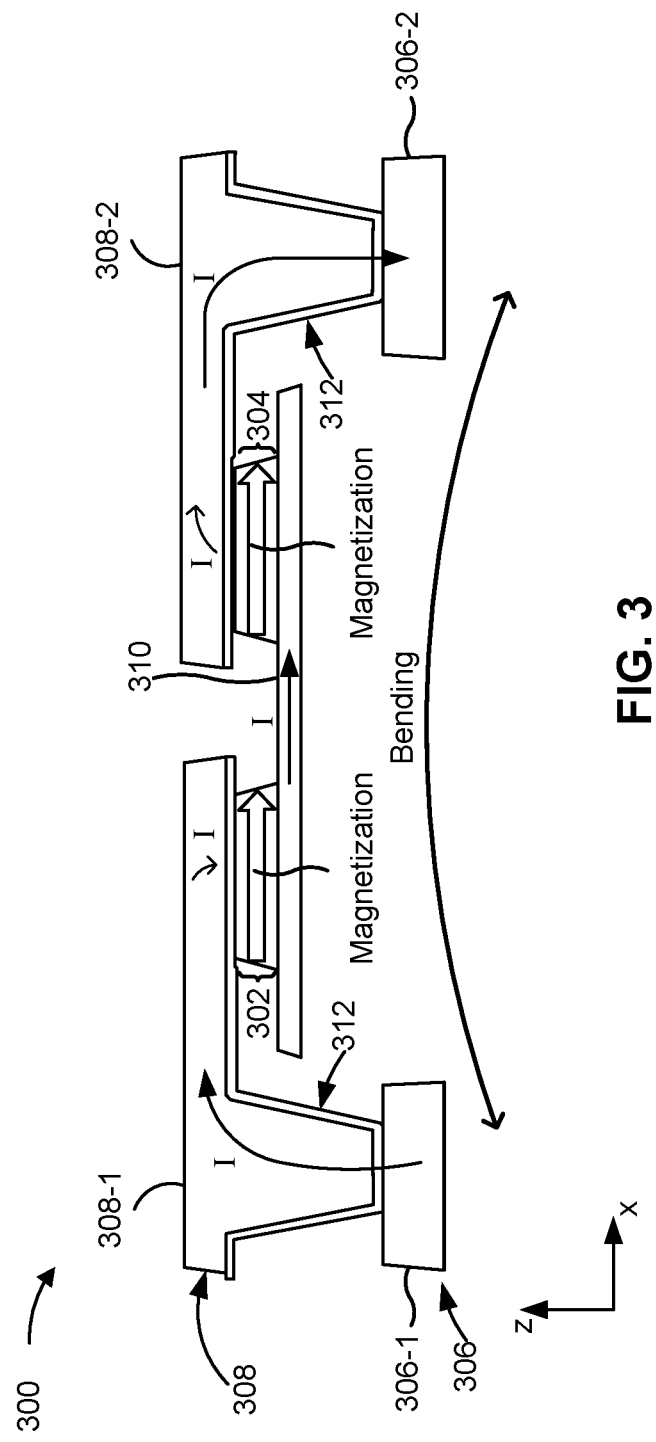
FIG. 3 shows a magnetoresistive sensor system according to one or more implementations.

FIG. 3 shows a magnetoresistive sensor system 300 according to one or more implementations. The magnetoresistive sensor system 300 includes a first magnetoresistive sensing element 302 (e.g., a first TMR magnetoresistive sensing element) and a second magnetoresistive sensing element 304 (e.g., a second TMR magnetoresistive sensing element). The first magnetoresistive sensing element 302 and the second magnetoresistive sensing element 304 may be similar to the magnetoresistive sensing element 100 described in connection with FIG. 1. Thus, the first magnetoresistive sensing element 302 and the second magnetoresistive sensing element 304 each have a corresponding layer stack.

The magnetoresistive sensor system 300 further includes a bottom conductor 306 (e.g., a bottom metal layer), a top conductor 308 (e.g., a top metal layer) that serves as a top electrode for the first magnetoresistive sensing element 302 and the second magnetoresistive sensing element 304, and a bottom electrode 310 that serves as a bottom electrode for the first magnetoresistive sensing element 302 and the second magnetoresistive sensing element 304. The bottom electrode 310 may be a seed layer (e.g., seed layer 102) that provides a conductive path between the first magnetoresistive sensing element 302 and the second magnetoresistive sensing element 304. Thus, the bottom electrode 310 may be part of the layer stack of the first magnetoresistive sensing element 302 and the second magnetoresistive sensing element 304. The bottom conductor 306 includes a first supply contact 306-1 and a second supply contact 306-2. A bias voltage may be applied across the first supply contact 306-1 and a second supply contact 306-2 to generate a current I. The current I flow through a first portion 308-1 of the top conductor 308, through the first magnetoresistive sensing element 302 to the bottom electrode 310, through the bottom electrode 310 to the second magnetoresistive sensing element 304, through the second magnetoresistive sensing element 304, through a second portion 308-2 of the top conductor 308, to the second supply contact 306-2.

In addition, the magnetoresistive sensor system 300 may include a stress inducing layer 312 coupled to the layer stacks of the first magnetoresistive sensing element 302 and the second magnetoresistive sensing element 304. The stress inducing layer 312 may be a conductive layer or a non-conductive layer. For example, the stress inducing layer 312 may comprise titanium nitride (TiN), tantalum nitride (TaN), tungsten (W), titanium tungsten (TiW), or silicon mononitride (SiN), but is not limited thereto. In some implementations, the stress inducing layer 312 may be arranged between the top conductor 308 and the first magnetoresistive sensing element 302. Alternatively, or additionally, the stress inducing layer 312 may be arranged between the top conductor 308 and the second magnetoresistive sensing element 304. In some implementations, the stress inducing layer 312 may be arranged between the bottom conductor 306 and the bottom electrode 310. In some implementations, the top conductor 308 may be the stress inducing layer. In some implementations, two stress inducing layers may be provided, such that one stress inducing layer is coupled to the top of the layer stacks and another stress inducing layer is coupled to the bottom of the layer stacks. Thus, both stress inducing layers may be configured to induce a respective mechanical stress in each layer stack along the mechanical stress axis such that the magnetization axis of each layer stack is aligned parallel with the mechanical stress axis or perpendicular with the mechanical stress axis.

The stress inducing layer 312 may be configured to apply a first force to the layer stack of the first magnetoresistive sensing element 302 to induce a mechanical stress in the layer stack along a first mechanical stress axis such that a magnetization axis of the first magnetoresistive sensing element 302 is aligned parallel with the first mechanical stress axis or perpendicular with the first mechanical stress axis, depending, for example, on the magnetostriction constant of the first magnetoresistive sensing element 302. Thus, the pinned magnetization and the reference magnetization of the first magnetoresistive sensing element 302 may be oriented in a predefined direction relative to the first mechanical stress axis based on the induced mechanical stress. In addition, the stress inducing layer 312 may be configured to apply a second force to the layer stack of the second magnetoresistive sensing element 304 to induce a mechanical stress in the layer stack along a second mechanical stress axis such that a magnetization axis of the second magnetoresistive sensing element 304 is aligned parallel with the second mechanical stress axis or perpendicular with the second mechanical stress axis, depending, for example, on the magnetostriction constant of the second magnetoresistive sensing element 304. Thus, the pinned magnetization and the reference magnetization of the second magnetoresistive sensing element 304 may be oriented in a predefined direction relative to the second mechanical stress axis based on the induced mechanical stress. In some implementations, the first mechanical stress axis is parallel with the second mechanical stress axis.

The first force and the second force may arise from film growth conditions of the stress inducing layer 312, as well as the dimensions of the stress inducing layer 312. In some implementations, the stress inducing layer 312 may be configured to apply the first force and the second force to the layer stacks to induce an elongation or a compression of the layer stacks in parallel with the mechanical stress axis or perpendicular with the mechanical stress axis. In some implementations, the first force and the second force are a compression forces that induces tensile stresses in the layer stacks in parallel with the mechanical stress axis or perpendicular with the mechanical stress axis. For example, the first force may be a first compression force that induces a first tensile stress in a reference layer of the first magnetoresistive sensing element 302 in parallel with the first mechanical stress axis and causes the magnetization axis of the first magnetoresistive sensing element 302 to align parallel with the first mechanical stress axis or perpendicular with the first mechanical stress axis. The second force may be a second compression force that induces a second tensile stress in a reference layer of the second magnetoresistive sensing element 304 in parallel with the second mechanical stress axis and causes the magnetization axis of the second magnetoresistive sensing element 304 to align parallel with the second mechanical stress axis or perpendicular with the second mechanical stress axis.

In some implementations, the stress inducing layer 312 is a compressive layer that causes the layer stacks to expand in a dimension that is parallel with the mechanical stress axis. In some implementations, wherein the stress inducing layer 312 is configured to deform, inducing the mechanical stress in the layer stacks and causing a deformation of the layer stacks in parallel with the mechanical stress axis. For example, the stress inducing layer 312 may be configured to bow or bend upward such that the first force and the second force are decompression forces exerted on the first magnetoresistive sensing element 302 and the second magnetoresistive sensing element 304 that induce mechanical stresses in the layer stacks along the mechanical stress axis. Alternatively, the stress inducing layer 312 may be configured to bow or bend downward such that the first force and the second force are compression forces exerted on the first magnetoresistive sensing element 302 and the second magnetoresistive sensing element 304 that induce mechanical stresses in the layer stacks along the mechanical stress axis. Accordingly, the stress inducing layer 312 may be configured to bow in a dimension parallel to the mechanical stress axis, causing the first force and the second force to be respectively applied to the layer stacks as a compression force or a decompression force. Thus, the mechanical stress axis may be predefined based on a designed deformation of the stress inducing layer 312 in order to control an orientation of the magnetization axis. In other words, instead of trying to prevent mechanical stress from affecting the layer stacks, the stress inducing layer 312 is designed to purposefully induce mechanical stress in a controlled and defined manner in order to control the orientation of the magnetization axis of the layer stacks. As a result, an orientation of the magnetization axes may be tuned to reduce sensing errors, strengthen the reference layer system to increase the TMR effect and sensitivity, and increase the lifetime of the sensing element. An increase in sensitivity leads to higher signal amplitudes, which are easier to process.

As indicated above, FIG. 3 is provided merely as an example. Other examples may differ from what is described with regard to FIG. 3. The number and arrangement of components shown in FIG. 3 are provided as an example. In practice, the magnetoresistive sensor system 300 may include additional elements, fewer elements, different elements, or differently arranged elements than those shown in FIG. 3.

Figure 4A:
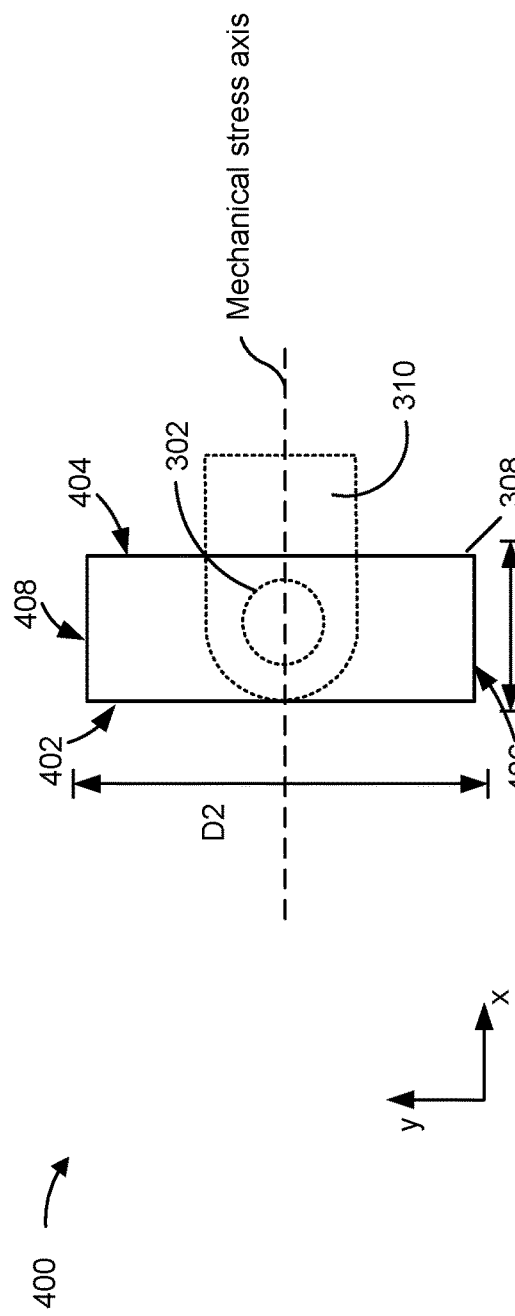
FIG. 4A shows a top view of a magnetoresistive sensor according to one or more implementations.
Figure 4B:
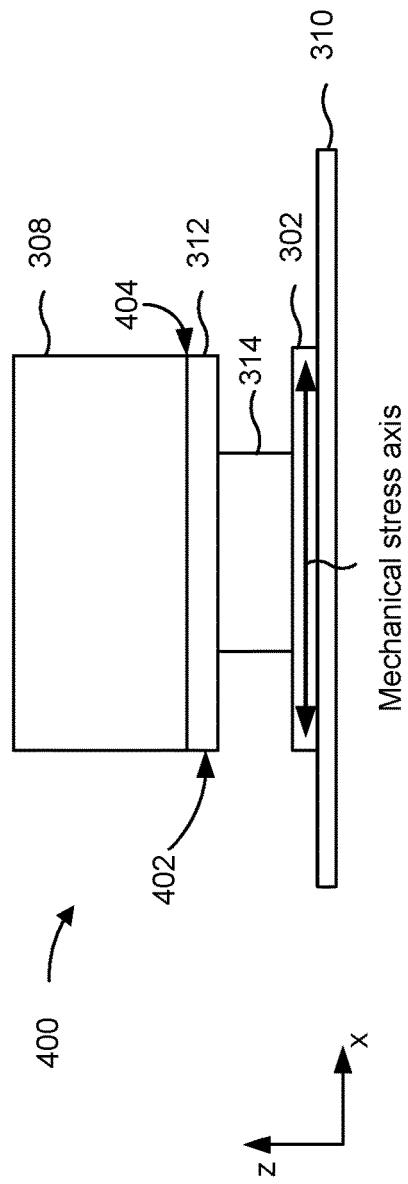
FIG. 4B shows a cross-sectional view of the magnetoresistive sensor of FIG. 4A according to one or more implementations.

FIG. 4A shows a top view of a magnetoresistive sensor 400 according to one or more implementations. FIG. 4B shows a cross-sectional view of the magnetoresistive sensor 400 according to one or more implementations. The magnetoresistive sensor 400 may be part of the magnetoresistive sensor system 300 described in connection with FIG. 3A. Thus, the magnetoresistive sensor 400 may include the first magnetoresistive sensing element 302, the top conductor 308, the bottom electrode 310, and the stress inducing layer 312. In addition, a via 314 may be provide between the stress inducing layer 312 and the first magnetoresistive sensing element 302 to provide an electrical path for current I.

The first magnetoresistive sensing element 302 comprises a sensor plane (e.g., an XY plane) defined by a first axis (e.g., an x-axis) and a second axis (e.g., a y-axis). The layers of the layer stack are stacked along a third axis (e.g., a z-axis) perpendicular to the sensor plane. In this example, the mechanical stress axis is collinear with the first axis. In other words, the mechanical stress axis is aligned with the first axis (e.g., the x-axis). Additionally, the stress inducing layer 312 has dimensions in the XY plane that are substantially similar to the dimensions of the top conductor 308 in the XY plane. For example, the stress inducing layer 312 has a first dimension D1 that defines a width of the stress inducing layer 312 along the first axis and has a second dimension D2 that defines a length of the stress inducing layer 312 along the second axis. Thus, the first dimension D1 is smaller than the second dimension D2. A deformation of the stress inducing layer 312 may be configured to occur along the smaller dimension (e.g., the first dimension) of the stress inducing layer 312. As a result, the mechanical stress axis of induced mechanical stress may be aligned with the first axis (e.g., the x-axis).

Accordingly, the first dimension D1 (e.g., a width dimension) is defined by a distance between a first lateral edge 402 and a second lateral edge 404 of the stress inducing layer 312, and the second dimension D2 (e.g., a length dimension) is defined by a distance between a third lateral edge 406 and a fourth lateral edge 408 of the stress inducing layer 312. The first magnetoresistive sensing element 302 is arranged between the first lateral edge 402 and the second lateral edge 404, and the first magnetoresistive sensing element 302 is arranged between the third lateral edge 406 and the fourth lateral edge 408.

The amount of force applied by the stress inducing layer 312 to the first magnetoresistive sensing element 302 decreases (e.g., exponentially) from an edge. For example, a force applied that induces mechanical stress along the x-axis decreases with distance from the first lateral edge 402 and the second lateral edge 404. Thus, the first dimension D1 should be sufficiently small to increase or to maximize the induced mechanical stress along the x-axis. For example, the first dimension D1 should be sufficiently small such that the first magnetoresistive sensing element 302 can be placed close to both the first lateral edge 402 and the second lateral edge 404 to increase the stress being induced along the x-axis. In addition, a force applied that induces mechanical stress along the y-axis decreases with distance from the third lateral edge 406 and the fourth lateral edge 408. Thus, the second dimension D2 should be sufficiently large to decrease or to minimize the induced mechanical stress along the y-axis. For example, the second dimension D2 should be sufficiently large such that the first magnetoresistive sensing element 302 can be placed far enough from both the third lateral edge 406 and the fourth lateral edge 408 to minimize any stress being induced along the y-axis.

In some implementations, the stress inducing layer 312 is configured to induce an elongation or a compression of the layer stack in a dimension of the layer stack corresponding to the first axis. For example, the stress inducing layer 312 may be under compressive stress such that the layers of the layer stack may expand or elongate in both a positive x-direction and a negative x-direction. In other words, a width of the layer stack may increase as a result of an expansion force applied to the layer stack. Additionally, in some implementations, the first magnetoresistive sensing element 302 is arranged far enough from the third lateral edge 406 and the fourth lateral edge 408 such that the stress inducing layer 312 induces substantially no elongation or compression of the layer stack in a dimension corresponding to the second axis (e.g., the y-axis). As a result, since the magnetic properties of the layer stack prefer to align along a tensile stress axis, a position of the first magnetoresistive sensing element 302 relative to the first lateral edge 402, the second lateral edge 404, third lateral edge 406, and the fourth lateral edge 408, in combination with the dimensions of the first dimension D1 and the second dimension D2, can ensure that the mechanical stress axis (e.g., the tensile stress axis) is aligned in a desired direction in order to align the magnetization axis with that desired direction.

As indicated above, FIGS. 4A and 4B are provided merely as an example. Other examples may differ from what is described with regard to FIGS. 4A and 4B.

Figure 4C:
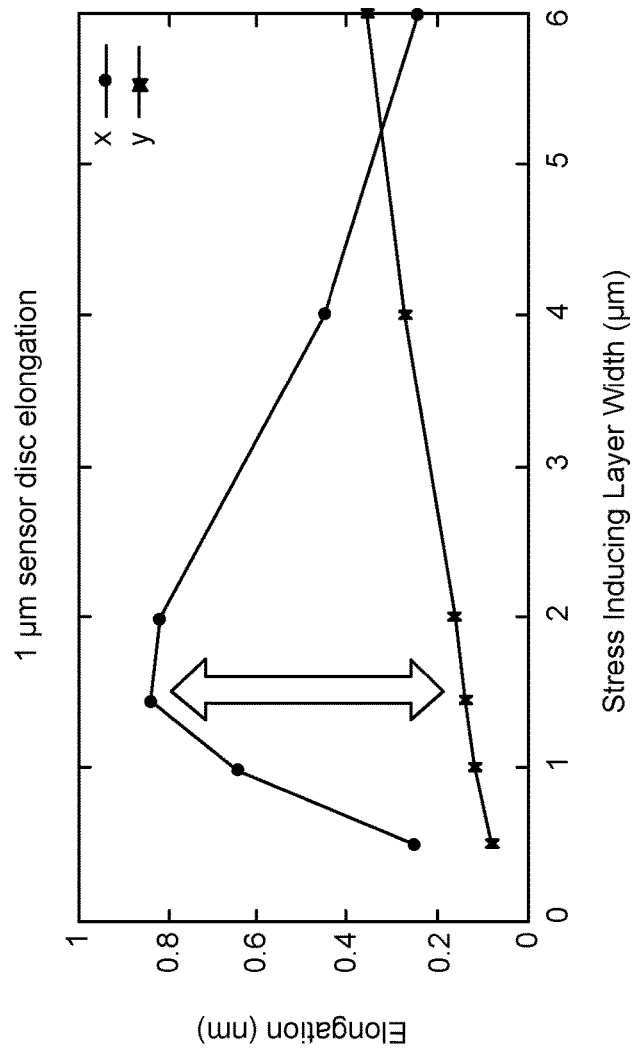
FIG. 4C is a diagram showing an elongation of a sensing element vs. a width of a stress inducing layer according to one or more implementations.

FIG. 4C is a diagram 400C showing an elongation of a sensing element vs. a width of a stress inducing layer according to one or more implementations. The diagram 400C may correspond to the magnetoresistive sensor 400 described in connection with FIGS. 4A and 4B. The diagram 400C plots the elongation of the sensing element in both the x-direction and the y-direction, with the width (e.g., the first dimension D1) of the stress inducing layer along the x-axis being varied and the length (e.g., the second dimension D2) of the stress inducing layer along the y-axis being fixed (e.g., at 5.25 µm). The x-direction may be the desired direction for the magnetization axis.

The elongation of the sensing element is measured in nanometers (nm) and the width of the stress inducing layer is measured in micrometers (µm) in the x-direction. The diagram 400C is for a sensing element having a 1 µm diameter, since a layer stack of a sensing element is typically disc-shaped or cylindrical. Higher amounts of induced mechanical stress produces larger amounts of elongation of the sensing element, which results is a stronger influence on an orientation of the magnetization axis in a desired direction. Thus, the induced mechanical stress or elongation should be maximized in the x-direction and minimized in the y-direction. In other words, an aspect ratio of the elongation in the x-direction vs. the elongation in the y-direction should be maximized to produce a maximum anisotropy of the magnetization. The anisotropy increases with the aspect ratio. The aspect ratio may be defined as an amount of change of the layer stack along the x-axis relative to an amount of change of the layer stack along the y-axis.

According to the diagram 400C, the maximum anisotropy is achieved for a width of about 1.5 µm of the stress inducing layer, where the aspect ratio of the elongation in the x-direction vs. the elongation in the y-direction is maximized and is greater than 4.

Accordingly, the stress inducing layer is configured to induce the layer stack to elongate by a first percentage in a dimension (e.g., an x-direction) corresponding to the x-axis and induce the layer stack to elongate by a second percentage in a dimension (e.g., a y-direction) corresponding to the y-axis. The first percentage is at least twice as much as the second percentage, to increase an anisotropy of the reference layer and the pinned layer magnetization. In some implementations, the first percentage is at least four times as much as the second percentage. In some implementations, the first percentage is at least ten times as much as the second percentage.

In some implementations, the sensing element has a diameter in a range of 0.5-1.5 µm and the mechanical stress axis is collinear with the x-axis. The stress inducing layer may have a first dimension D1 corresponding to the x-axis and a second dimension D2 corresponding to the y-axis. The second dimension D2 may be at least two times larger than the first dimension D1, with the first dimension being in a range of 1.0-3.0 µm in order to produce an aspect ratio that is sufficiently large to orient the magnetization axis in the x-direction.

In some implementations, the stress inducing layer has a width dimension in a range of 1-3 µm that is defined by the first lateral edge 402 and the second lateral edge 404 and has a length dimension defined by the third lateral edge 406 and the fourth lateral edge 408. The layer stack is arranged between the first lateral edge 402 and the second lateral edge 404 in the x-direction and the layer stack is arranged between the third lateral edge 406 and the fourth lateral edge 408 in the y-direction. The layer stack has an outer periphery that may have first distances that are no more than 2 µm from the first lateral edge 402 and the second lateral edge 404, respectively. In other words, the layer stack of the first magnetoresistive sensing element 302, for example, may be no further from the first lateral edge 402 or the second lateral edge 404 by a distance of 2 µm. Thus, a closest point of the layer stack to the first lateral edge 402 is no more than 2 µm, and a closest point of the layer stack to the second lateral edge 404 is no more than 2 µm. The sensing element may have a diameter in a range of 0.5-1.5 µm such that this condition is satisfied for a stress inducing layer having a width dimension in a range of 1-3 µm.

In addition, the outer periphery of the layer stack has second distances that are greater than 2 µm from the third lateral edge 406 and the fourth lateral edge 408, respectively. In other words, the layer stack of the first magnetoresistive sensing element 302, for example, is at least 2 µm from the third lateral edge 406 and at least 2 µm from the fourth lateral edge 408. Thus, a closest point of the layer stack to the third lateral edge 406 is greater than 2 µm, and a closest point of the layer stack to the fourth lateral edge 408 is greater than 2 µm.

In addition, a minimum distance of the second distances is at least two times greater than a maximum distance of the first distances.

As a result of this configuration, the aspect ratio may be produced that is sufficiently large to orient the magnetization axis in along the x-axis.

As indicated above, FIG. 4C is provided merely as an example. Other examples may differ from what is described with regard to FIG. 4C.

Figure 4D:
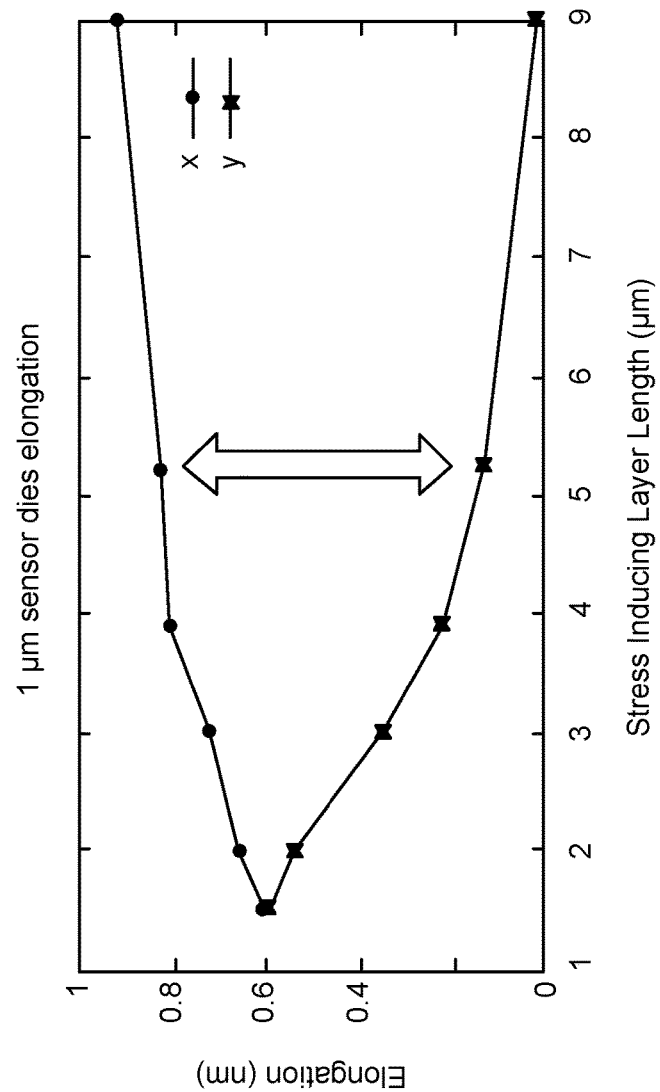
FIG. 4D is a diagram showing an elongation of a sensing element vs. a length of a stress inducing layer according to one or more implementations.

FIG. 4D is a diagram 400D showing an elongation of a sensing element vs. a length (y) of a stress inducing layer according to one or more implementations. The diagram 400D may correspond to the magnetoresistive sensor 400 described in connection with FIGS. 4A and 4B. The diagram 400D plots the elongation of the sensing element in both the x-direction and the y-direction, with the length (e.g., the second dimension D2) of the stress inducing layer along the y-axis being varied and the width (e.g., the first dimension D1) of the stress inducing layer along the x-axis being fixed (e.g., at 1.5 µm). The x-direction may be the desired direction for the magnetization axis.

The elongation of the sensing element is measured in nanometers (nm) and the length of the stress inducing layer is measured in micrometers (µm) in the y-direction. The diagram 400D is for a sensing element having a 1 µm diameter. Higher amounts of induced mechanical stress produces larger amounts of elongation of the sensing element, which results is a stronger influence on an orientation of the magnetization axis in a desired direction. Thus, the induced mechanical stress or elongation should be maximized in the x-direction and minimized in the y-direction. In other words, an aspect ratio of the elongation in the x-direction vs. the elongation in the y-direction should be maximized to produce a maximum anisotropy of the magnetization. The anisotropy increases with the aspect ratio. The aspect ratio may be defined as an amount of change of the layer stack along the x-axis relative to an amount of change of the layer stack along the y-axis. Diagram 400D demonstrates that the aspect ratio increases with an increase in the length of the stress inducing layer. Thus, the length of the stress inducing layer should be sufficiently long such that the aspect ratio is at least greater than two, or at least greater than four. The anisotropy of the magnetic reference layer and the pinned layer increases with the aspect ratio.

In some implementations, the sensing element has a diameter in a range of 0.5-1.5 µm and the mechanical stress axis is collinear with the x-axis. The stress inducing layer may have a first dimension D1 corresponding to the x-axis and a second dimension D2 corresponding to the y-axis. The second dimension D2 may be at least two times larger than the first dimension D1, with the first dimension being in a range of 1.0-3.0 µm in order to produce an aspect ratio that is sufficiently large to orient the magnetization axis in the x-direction.

In some implementations, the stress inducing layer has a width dimension in a range of 1-3 µm that is defined by the first lateral edge 402 and the second lateral edge 404 and has a length dimension defined by the third lateral edge 406 and the fourth lateral edge 408. The layer stack is arranged between the first lateral edge 402 and the second lateral edge 404 in the x-direction and the layer stack is arranged between the third lateral edge 406 and the fourth lateral edge 408 in the y-direction. The layer stack has an outer periphery that may have first distances that are no more than 2 µm from the first lateral edge 402 and the second lateral edge 404, respectively. In other words, the layer stack of the first magnetoresistive sensing element 302, for example, may be no further from the first lateral edge 402 or the second lateral edge 404 by a distance of 2 µm. Thus, a closest point of the layer stack to the first lateral edge 402 is no more than 2 µm, and a closest point of the layer stack to the second lateral edge 404 is no more than 2 µm. The sensing element may have a diameter in a range of 0.5-1.5 µm such that this condition is satisfied for a stress inducing layer having a width dimension in a range of 1-3 µm.

In addition, the outer periphery of the layer stack has second distances that are greater than 2 µm from the third lateral edge 406 and the fourth lateral edge 408, respectively. In other words, the layer stack of the first magnetoresistive sensing element 302, for example, is at least 2 µm from the third lateral edge 406 and at least 2 µm from the fourth lateral edge 408. Thus, a closest point of the layer stack to the third lateral edge 406 is greater than 2 µm, and a closest point of the layer stack to the fourth lateral edge 408 is greater than 2 µm.

In addition, a minimum distance of the second distances is at least two times greater than a maximum distance of the first distances.

As a result of this configuration, the aspect ratio may be produced that is sufficiently large to orient the magnetization axis along the x-axis.

As indicated above, FIG. 4D is provided merely as an example. Other examples may differ from what is described with regard to FIG. 4D.

Figure 5:
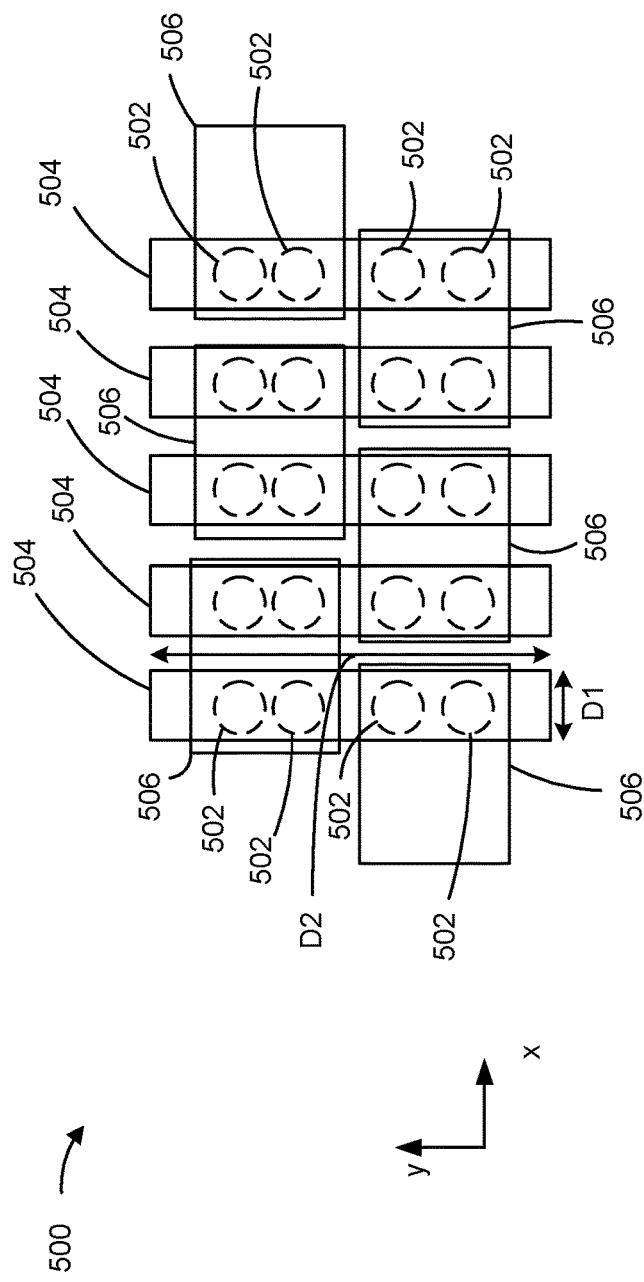
FIG. 5 shows a top view of a magnetoresistive sensor system according to one or more implementations.

FIG. 5 shows a top view of a magnetoresistive sensor system 500 according to one or more implementations. The magnetoresistive sensor system 500 includes a plurality of sensing elements 502 arranged between a respective top conductor 504 (e.g., a top metal layer) and a respective bottom conductor 506 (e.g., a bottom electrode). Stress inducing layers may also be coupled to the plurality of sensing elements 502 in a manner similar described in connection with FIG. 3A (e.g., between sensing elements 502 and respective top conductors 504) such that the stress inducing layers and the top conductors 504 have similar lateral dimensions. Alternatively, the top conductors 504 may be stress inducing layers. The stress inducing layers may have lateral dimensions that fulfill the aspect ratio configuration described above in connection with FIGS. 4A-4D. As a result, mechanical stress in each layer stack of the plurality of sensing elements 502 may be induced along a mechanical stress axis that is oriented along the x-axis, and the pinned magnetization and the reference magnetization of each sensing element 502 may be aligned parallel with the mechanical stress axis or perpendicular with the mechanical stress axis, depending on the magnetostriction constant of each sensing element 502.

Accordingly, each stress inducing layer may be a straight structure having a first dimension D1 that extends in the x-direction and a second dimension D2 that extends in the y-direction perpendicular to the x-direction. The first dimension D1 may be smaller than the second dimension D2, and the first dimension D1 undergoes a bending stress resulting in a force applied to each of the layer stacks of the sensing elements 502. The sensing elements 502 coupled to a same stress inducing layer are spaced apart in the y-direction. In addition, the x-direction is parallel to the mechanical stress axes of the sensing elements 502.

As indicated above, FIG. 5 is provided merely as an example. Other examples may differ from what is described with regard to FIG. 5.

Figure 6:
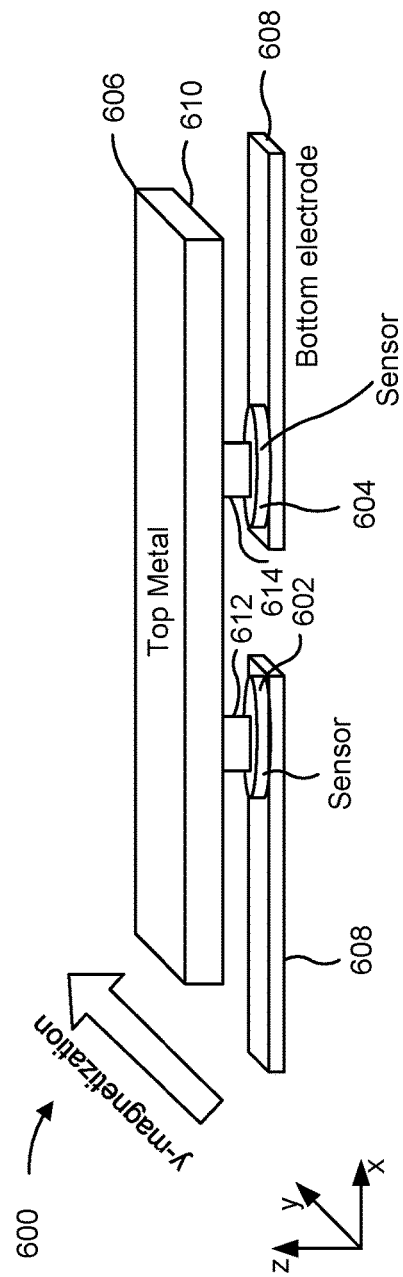
FIG. 6 shows a magnetoresistive sensor system according to one or more implementations.

FIG. 6 shows a magnetoresistive sensor system 600 according to one or more implementations. The magnetoresistive sensor system 600 includes a first sensing element 602 and a second sensing element 604 arranged between a top conductor 606 (e.g., a top metal layer) and a respective bottom conductor 608 (e.g., a bottom electrode). The magnetoresistive sensor system 600 may also include a stress inducing layer 610. Additionally, or alternatively, the top conductor 606 may be a stress inducing layer. A first via 612 may couple the first sensing element 602 to the top conductor 606, and a second via 614 may couple the second sensing element 604 to the top conductor 606.

Lateral dimensions of the stress inducing layer 610 are configured such that the stress inducing layer 610 bows in the y-direction, inducing a first mechanical stress in the first sensing element 602 in the y-direction and a second mechanical stress in the second sensing element 604 in the y-direction. For example, the stress inducing layer 610 may have lateral dimensions that fulfill the aspect ratio configuration as similarly described above in connection with FIGS. 4A-4D, with the exception that the width dimension of the stress inducing layer 610 extends in the y-direction and the length dimension of the stress inducing layer 610 extends in the x-direction. Thus, the pinned magnetization and the reference magnetization of the first sensing element 602 and the second sensing element 604 may be aligned along the y-axis.

As indicated above, FIG. 6 is provided merely as an example. Other examples may differ from what is described with regard to FIG. 6.

Figure 7:
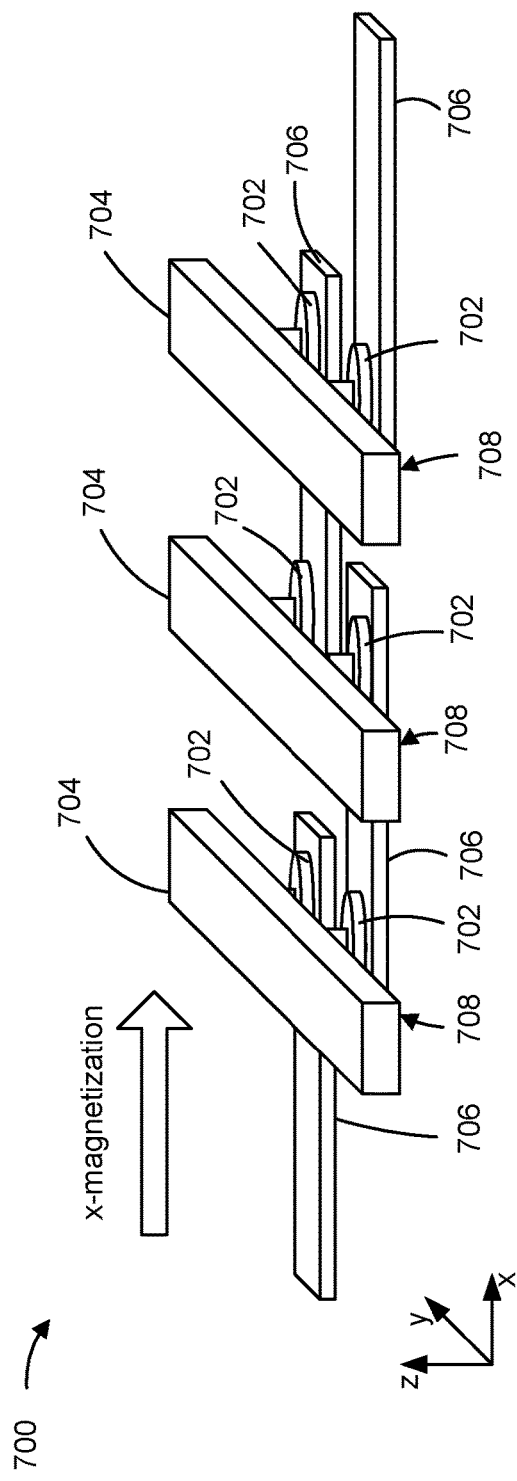
FIG. 7 shows a magnetoresistive sensor system according to one or more implementations.

FIG. 7 shows a magnetoresistive sensor system 700 according to one or more implementations. The magnetoresistive sensor system 700 includes a plurality of sensing elements 702 arranged between a respective top conductor 704 (e.g., a top metal layer) and a respective bottom conductor 706 (e.g., a bottom electrode). Stress inducing layers 708 may also be coupled to the plurality of sensing elements 702 in a manner similar described in connection with FIG. 3A (e.g., between sensing elements 702 and respective top conductors 704) such that the stress inducing layers 708 and the top conductors 704 have similar lateral dimensions. Alternatively, the top conductors 704 may be stress inducing layers. The stress inducing layers 708 may have lateral dimensions that fulfill the aspect ratio configuration described above in connection with FIGS. 4A-4D.

Lateral dimensions of the stress inducing layers 708 are configured such that each of the stress inducing layers 708 bows in the x-direction, inducing a respective mechanical stress on each of the sensing elements 702 in the x-direction.

As a result, mechanical stress in each layer stack of the plurality of sensing elements 702 may be induced along a mechanical stress axis that is oriented along the x-axis, and the pinned magnetization and the reference magnetization of each sensing element 702 may be aligned along the mechanical stress axis (e.g., along the x-axis).

Accordingly, each stress inducing layer 708 may be a straight structure having a first dimension that extends in the x-direction and a second dimension that extends in the y-direction perpendicular to the x-direction. The first dimension may be smaller than the second dimension, and the first dimension may undergo a bending stress resulting in a force applied to each of the layer stacks of the sensing elements 702. The sensing elements 702 coupled to a same stress inducing layer are spaced apart in the y-direction. In addition, the x-direction is parallel to the mechanical stress axes of the sensing elements 702.

As indicated above, FIG. 7 is provided merely as an example. Other examples may differ from what is described with regard to FIG. 7.

Figure 8:
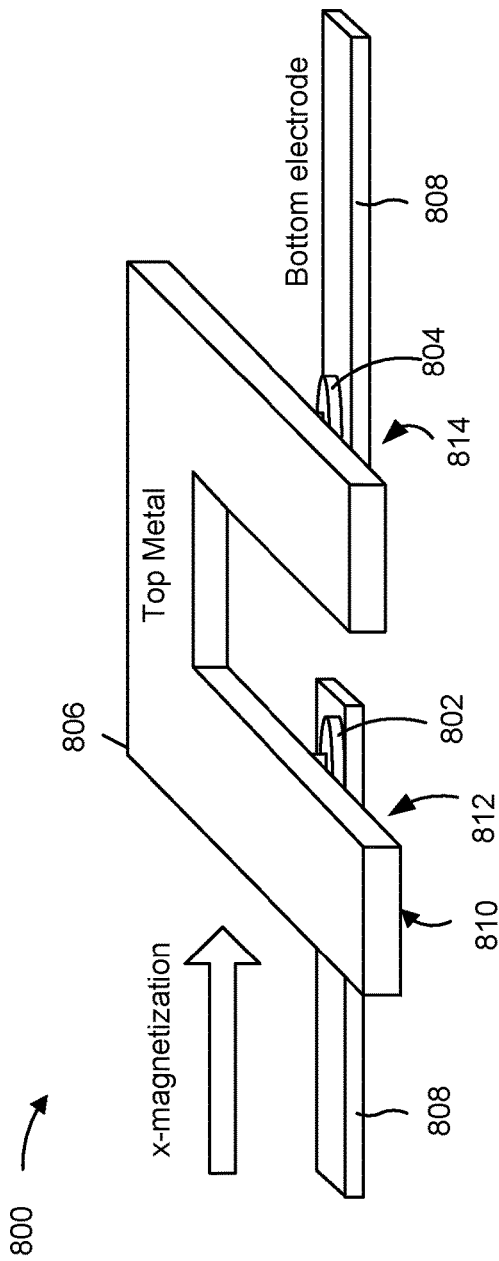
FIG. 8 shows a magnetoresistive sensor system according to one or more implementations.

FIG. 8 shows a magnetoresistive sensor system 800 according to one or more implementations. The magnetoresistive sensor system 800 includes a first sensing element 802 and a second sensing element 804 arranged between a top conductor 806 (e.g., a top metal layer) and a respective bottom conductor 808 (e.g., a bottom electrode). The top conductor 806 may have a U-shape in order to align the pinned magnetizations and the reference magnetizations of the first sensing element 802 and the second sensing element 804 along the x-axis. The magnetoresistive sensor system 800 may also include a stress inducing layer 810 having a U-shape that is similar to the U-shape of the top conductor 806. Additionally, or alternatively, the top conductor 806 may be a stress inducing layer.

Lateral dimensions of the stress inducing layer 810 are configured such a first portion 812 of the stress inducing layer 810, coupled to the first sensing element 802, bows in the x-direction, inducing a first mechanical stress in the first sensing element 802 in the x-direction. For example, the first portion 812 of the stress inducing layer 810 may have lateral dimensions that fulfill the aspect ratio configuration as similarly described above in connection with FIGS. 4A-4D. In addition, lateral dimensions of the stress inducing layer 810 are configured such a second portion 814 of the stress inducing layer 810, coupled to the second sensing element 804, bows in the x-direction, inducing a second mechanical stress in the second sensing element 804 in the x-direction. For example, the second portion 814 of the stress inducing layer 810 may have lateral dimensions that fulfill the aspect ratio configuration as similarly described above in connection with FIGS. 4A-4D. Thus, the pinned magnetization and the reference magnetization of the first sensing element 802 and the second sensing element 804 may be aligned along the x-axis.

As indicated above, FIG. 8 is provided merely as an example. Other examples may differ from what is described with regard to FIG. 8.

Figure 9:
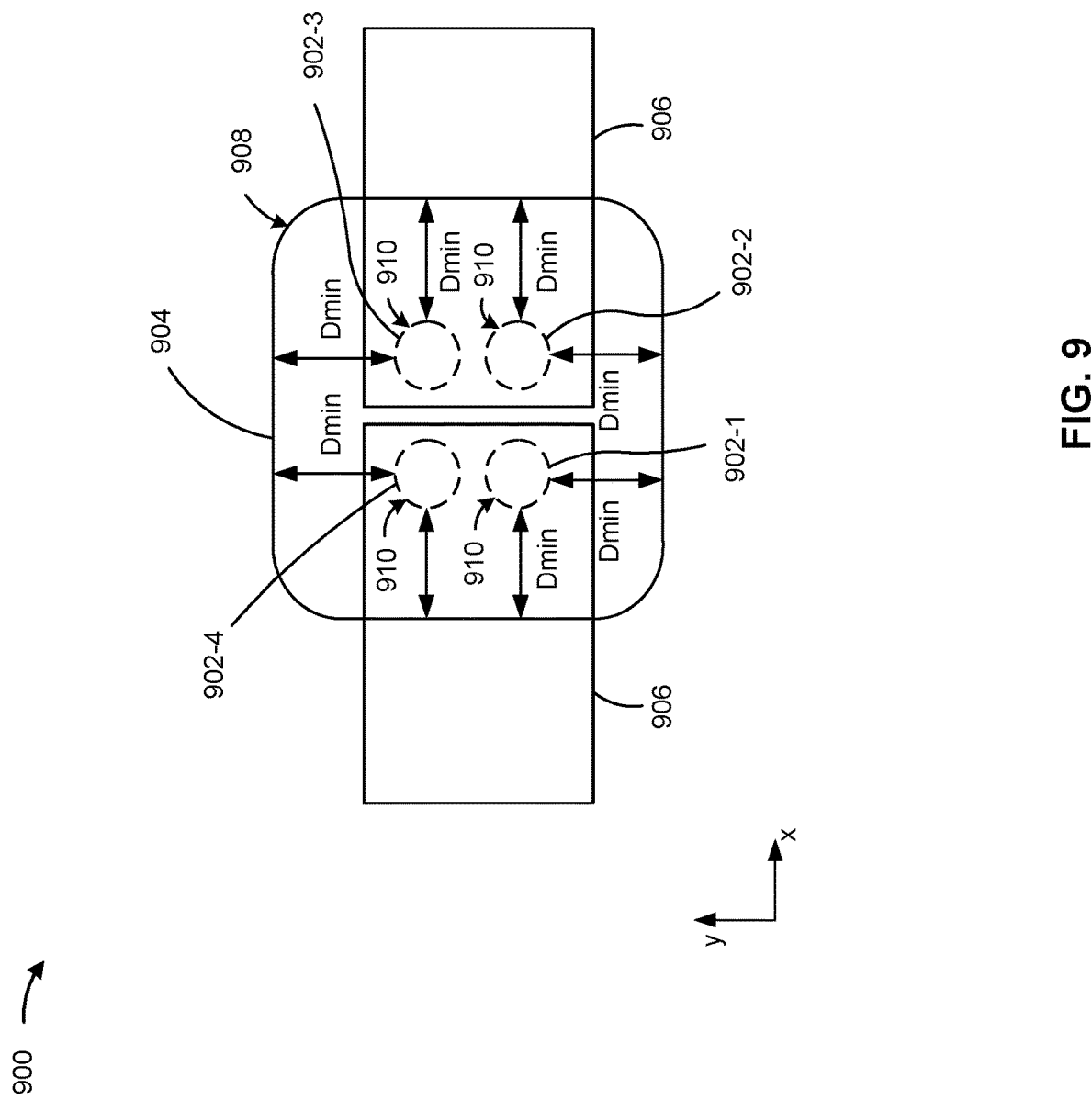
FIG. 9 shows a magnetoresistive sensor system according to one or more implementations.

FIG. 9 shows a magnetoresistive sensor system 900 according to one or more implementations. The magnetoresistive sensor system 900 includes a plurality of sensing elements 902 (e.g., sensing elements 902-1, 902-2, 902-3, and 902-4) arranged between a top conductor 904 (e.g., a top metal layer) and a respective bottom conductor 906 (e.g., a bottom electrode). Thus, the top conductor 904 is a conductive layer coupled to a top of the layer stacks. The top conductor 904 has a first outer periphery 908 that defines lateral edges of the top conductor 904. In addition, the layer stack of each sensing element 902 has a second outer periphery 910 that defines lateral edges of the layer stack. Each of the sensing elements 902-1, 902-2, 902-3, and 902-4 has at least a minimum distance Dmin between the first outer periphery 908 and the second outer periphery 910 that is greater than 1 μm. In other words, each of the sensing elements 902-1, 902-2, 902-3, and 902-4 is located at least 1 μm from the first outer periphery 908. Since an amount of force applied by the top conductor 904 to any of the sensing elements 902 decreases (e.g., exponentially) with increasing distance from the first outer periphery 908, the amount of force applied to the sensing elements 902 can be minimized by distancing the sensing elements 902 from the first outer periphery 908. As a result, a preferred magnetic anisotropy of the pinned magnetization and the reference magnetization of the sensing elements 902 may be substantially unaffected by the top conductor 904. In other words, instead of trying to induce mechanical stress in each of the sensing elements 902, the top conductor 904 may be large enough and the sensing elements 902 may be arranged sufficiently far from the first outer periphery 908 to reduce or prevent mechanical stress from affecting the orientations of the sensing elements 902.

As indicated above, FIG. 9 is provided merely as an example. Other examples may differ from what is described with regard to FIG. 9.

The following provides an overview of some Aspects of the present disclosure:

Aspect 1: A magnetoresistive sensor, comprising: a sensing element having a layer stack, the layer stack comprising: a reference layer having a fixed reference magnetization aligned with a magnetization axis; a magnetic free layer having a magnetically free magnetization, wherein the magnetically free magnetization is variable in a presence of an external magnetic field; and a non-magnetic layer arranged between the reference layer and the magnetic free layer; and a stress inducing layer coupled to the layer stack, wherein the stress inducing layer is configured to apply a force to the layer stack to induce a mechanical stress in the layer stack along a mechanical stress axis such that the magnetization axis is aligned parallel with the mechanical stress axis or perpendicular with the mechanical stress axis.

Aspect 2: The magnetoresistive sensor of Aspect 1, wherein the stress inducing layer is configured to apply the force to the layer stack to induce an elongation or a compression of the layer stack in parallel with the mechanical stress axis or perpendicular with the mechanical stress axis.

Aspect 3: The magnetoresistive sensor of any of Aspects 1-2, wherein the force is a compression force that induces a tensile stress in the layer stack in parallel with the mechanical stress axis or perpendicular with the mechanical stress axis.

Aspect 4: The magnetoresistive sensor of any of Aspects 1-3, wherein the stress inducing layer is a compressive layer that causes the layer stack to expand in a dimension that is parallel with the mechanical stress axis.

Aspect 5: The magnetoresistive sensor of any of Aspects 1-4, wherein the stress inducing layer is configured to deform, inducing the mechanical stress in the layer stack and causing a deformation of the layer stack in parallel with the mechanical stress axis.

Aspect 6: The magnetoresistive sensor of any of Aspects 1-5, wherein the mechanical stress axis is predefined in order to control an orientation of the magnetization axis.

Aspect 7: The magnetoresistive sensor of any of Aspects 1-6, further comprising: a first conductive layer configured to conduct a current; and a second conductive layer configured to conduct the current, wherein the layer stack is arranged between the first conductive layer and the second conductive layer, wherein the stress inducing layer is arranged between the first conductive layer and the layer stack.

Aspect 8: The magnetoresistive sensor of Aspect 7, further comprising: a second stress inducing layer is arranged between the second conductive layer and the layer stack, wherein the second stress inducing layer is configured to induce a second mechanical stress in the layer stack along the mechanical stress axis such that the magnetization axis is aligned parallel with the mechanical stress axis or perpendicular with the mechanical stress axis.

Aspect 9: The magnetoresistive sensor of any of Aspects 1-8, wherein the stress inducing layer is configured to bow in a dimension parallel to the mechanical stress axis, causing the force to be applied to the layer stack as a compression force or a decompression force.

Aspect 10: The magnetoresistive sensor of any of Aspects 1-9, wherein the sensing element comprises a sensor plane defined by a first axis and a second axis, wherein layers of the layer stack are stacked along a third axis perpendicular to the first axis and the second axis, wherein the mechanical stress axis is aligned with the first axis, wherein the stress inducing layer has a first dimension that extends parallel to the first axis and a second dimension that extends parallel to the second axis, and wherein the first dimension is smaller than the second dimension.

Aspect 11: The magnetoresistive sensor of any of Aspects 1-10, wherein the layer stack comprises a reference layer system comprising: a pinned layer having a pinned magnetization via coupling to an antiferromagnet; the reference layer having the fixed reference magnetization that is oriented anti-parallel to the pinned magnetization; and a coupling interlayer arranged between the pinned layer and the reference layer and configured to couple the fixed reference magnetization to be anti-parallel to the pinned magnetization, wherein the stress inducing layer is configured to apply the force to the layer stack along the mechanical stress axis such that the pinned magnetization is aligned with the mechanical stress axis or perpendicular with the mechanical stress axis.

Aspect 12: The magnetoresistive sensor of Aspect 11, wherein the stress inducing layer is configured to apply the force to the layer stack to induce an elongation of the layer stack in parallel with the mechanical stress axis.

Aspect 13: The magnetoresistive sensor of any of Aspects 1-12, wherein the sensing element comprises a sensor plane defined by a first axis and a second axis, wherein layers of the layer stack are stacked along a third axis perpendicular to the sensor plane, wherein the mechanical stress axis is collinear with the first axis, wherein the stress inducing layer is configured to induce an elongation or a compression of the layer stack in a first dimension corresponding to the first axis and induce substantially no elongation or compression of the layer stack in a second dimension corresponding to the second axis.

Aspect 14: The magnetoresistive sensor of any of Aspects 1-13, wherein the sensing element comprises a sensor plane defined by a first axis and a second axis, wherein layers of the layer stack are stacked along a third axis perpendicular to the sensor plane, wherein the mechanical stress axis is aligned with the first axis, wherein the stress inducing layer is configured to induce the reference layer to elongate by a first percentage in a first dimension corresponding to the first axis and induce the reference layer to elongate by a second percentage in a second dimension corresponding to the second axis, and wherein the first percentage is at least twice as much as the second percentage, to increase an anisotropy of the reference layer magnetization.

Aspect 15: The magnetoresistive sensor of Aspect 14, wherein the first percentage is at least four times as much as the second percentage.

Aspect 16: The magnetoresistive sensor of any of Aspects 1-15, wherein the sensing element comprises a sensor plane defined by a first axis and a second axis, wherein the sensing element has a diameter of 0.5-1.5 micrometers (µm) in the sensor plane, wherein layers of the layer stack are stacked along a third axis perpendicular to the sensor plane, wherein the mechanical stress axis is collinear with the first axis, wherein the stress inducing layer has a first dimension corresponding to the first axis and a second dimension corresponding to the second axis, wherein the second dimension is at least two times larger than the first dimension, and wherein the first dimension is 1.0-3.0 µm.

Aspect 17: The magnetoresistive sensor of any of Aspects 1-16, wherein the stress inducing layer has a width dimension of 1-3 micrometers (µm) defined by a first lateral edge and a second lateral edge and a length dimension defined by a third lateral edge and a fourth lateral edge, wherein the layer stack is arranged between the first lateral edge and the second lateral edge and the layer stack is arranged between the third lateral edge and the fourth lateral edge, wherein the layer stack has an outer periphery having first distances that are no more than 2 µm from the first lateral edge and the second lateral edge, respectively, and second distances that are greater than 2 µm from the third lateral edge and the fourth lateral edge, respectively, wherein a minimum distance of the second distances is at least two times greater than a maximum distance of the first distances.

Aspect 18: The magnetoresistive sensor of any of Aspects 1-17, wherein the mechanical stress increases a magnetoresistive effect of the sensing element.

Aspect 19: A magnetoresistive sensor, comprising: a first sensing element having a first layer stack, the first layer stack comprising: a first reference layer having a first fixed reference magnetization aligned with a first magnetization axis; a first magnetic free layer having a first magnetically free magnetization, wherein the first magnetically free magnetization is variable in a presence of an external magnetic field; and a first non-magnetic layer arranged between the first reference layer and the first magnetic free layer; a second sensing element having a second layer stack, the second layer stack comprising: a second reference layer having a second fixed reference magnetization aligned with a second magnetization axis; a second magnetic free layer having a second magnetically free magnetization, wherein the second magnetically free magnetization is variable in a presence of the external magnetic field; and a second non-magnetic layer arranged between the second reference layer and the second magnetic free layer; and a stress inducing layer coupled to the first layer stack and the second layer stack, wherein the stress inducing layer is configured to apply a first force to the first layer stack to induce a first mechanical stress in the first layer stack along a first mechanical stress axis such that the first magnetization axis is aligned parallel with the first mechanical stress axis or perpendicular with the first mechanical stress axis, and apply a second force to the second layer stack to induce a second mechanical stress in the second layer stack along a second mechanical stress axis such that the second magnetization axis is aligned parallel with the second mechanical stress axis or perpendicular with the second mechanical stress axis.

Aspect 20: The magnetoresistive sensor of Aspect 19, wherein the first mechanical stress axis is parallel with the second magnetization axis.

Aspect 21: The magnetoresistive sensor of any of Aspects 19-20, wherein the first force is a first compression force that induces a first tensile stress in the first reference layer in parallel with the first mechanical stress axis and causes the first magnetization axis to align parallel with the first mechanical stress axis or perpendicular with the first mechanical stress axis, and wherein the second force is a second compression force that induces a second tensile stress in the second reference layer in parallel with the second mechanical stress axis and causes the second magnetization axis to align parallel with the second mechanical stress axis or perpendicular with the second mechanical stress axis.

Aspect 22: The magnetoresistive sensor of any of Aspects 19-21, wherein the stress inducing layer is a straight structure having a first dimension that extends in a first direction and a second dimension that extends in a second direction perpendicular to the first direction, wherein the first dimension is smaller than the second dimension and the first dimension undergoes a bending stress resulting in the first force applied to the first layer stack and the second force applied to the second layer stack, wherein the first sensing element and the second sensing element are spaced apart in the second direction, and wherein the first direction is parallel to the first mechanical stress axis and the second mechanical stress axis.

Aspect 23: The magnetoresistive sensor of any of Aspects 19-22, wherein the stress inducing layer is a U-shaped structure having a first segment coupled to the first layer stack, a second segment coupled to the second layer stack, and a third segment coupled to and extending between the first segment and the second segment in a lateral direction, wherein the lateral direction is parallel to the first mechanical stress axis and the second mechanical stress axis, wherein the first segment is configured to apply the first force to the first layer stack, inducing the first mechanical stress along the first mechanical stress axis, and wherein the second segment is configured to apply the second force to the second layer stack, inducing the second mechanical stress along the second mechanical stress axis.

Aspect 24: A magnetoresistive sensor, comprising: a sensing element having a layer stack stacked in a vertical dimension, the layer stack comprising: a reference layer having a fixed reference magnetization aligned with a magnetization axis; a magnetic free layer having a magnetically free magnetization, wherein the magnetically free magnetization is variable in a presence of an external magnetic field; and a non-magnetic layer arranged between the reference layer and the magnetic free layer; and a conductive layer coupled to a top or a bottom of the layer stack, wherein the conductive layer has a first outer periphery that defines lateral edges of the conductive layer, wherein the layer stack has a second outer periphery that defines lateral edges of the layer stack, wherein a minimum distance between the first outer periphery and the second outer periphery is greater than 1 micrometer (µm).

Aspect 25: The magnetoresistive sensor of Aspect 24, wherein a preferred magnetic anisotropy of the fixed reference magnetization is substantially unaffected by the conductive layer.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A magnetoresistive sensor, comprising:
a sensing element having a layer stack, the layer stack comprising:
a reference layer having a fixed reference magnetization aligned with a magnetization axis;
a magnetic free layer having a magnetically free magnetization, wherein the magnetically free magnetization is variable in a presence of an external magnetic field; and
a non-magnetic layer arranged between the reference layer and the magnetic free layer; and
a stress inducing layer coupled to the layer stack, wherein the stress inducing layer is configured to apply a force to the layer stack to induce a mechanical stress in the layer stack along a mechanical stress axis such that the magnetization axis is aligned parallel with the mechanical stress axis or perpendicular with the mechanical stress axis,
wherein the sensing element comprises a sensor plane defined by a first axis and a second axis,
wherein the sensing element has a diameter of 0.5-1.5 micrometers (μm) in the sensor plane,
wherein layers of the layer stack are stacked along a third axis perpendicular to the sensor plane,
wherein the mechanical stress axis is collinear with the first axis, and
wherein the stress inducing layer has a first dimension corresponding to the first axis and a second dimension corresponding to the second axis, wherein the second dimension is at least two times larger than the first dimension, and wherein the first dimension is 1.0-3.0 μm.

2. The magnetoresistive sensor of claim 1, wherein the stress inducing layer is configured to apply the force to the layer stack to induce an elongation or a compression of the layer stack in parallel with the mechanical stress axis or perpendicular with the mechanical stress axis.

3. The magnetoresistive sensor of claim 1, wherein the force is a compression force that induces a tensile stress in the layer stack in parallel with the mechanical stress axis or perpendicular with the mechanical stress axis.

4. The magnetoresistive sensor of claim 1, wherein the stress inducing layer is a compressive layer that causes the layer stack to expand in a dimension that is parallel with the mechanical stress axis.

5. The magnetoresistive sensor of claim 1, wherein the stress inducing layer is configured to deform, inducing the mechanical stress in the layer stack and causing a deformation of the layer stack in parallel with the mechanical stress axis.

6. The magnetoresistive sensor of claim 1, wherein the mechanical stress axis is predefined in order to control an orientation of the magnetization axis.

7. The magnetoresistive sensor of claim 1, wherein the stress inducing layer is configured to bow in a dimension parallel to the mechanical stress axis, causing the force to be applied to the layer stack as a compression force or a decompression force.

8. The magnetoresistive sensor of claim 1, wherein the sensing element comprises a sensor plane defined by a first axis and a second axis,
wherein layers of the layer stack are stacked along a third axis perpendicular to the first axis and the second axis,
wherein the mechanical stress axis is aligned with the first axis,
wherein the stress inducing layer has a first dimension that extends parallel to the first axis and a second dimension that extends parallel to the second axis, and
wherein the first dimension is smaller than the second dimension.

9. The magnetoresistive sensor of claim 1,
wherein the stress inducing layer is configured to induce an elongation or a compression of the layer stack in a first dimension corresponding to the first axis and induce substantially no elongation or compression of the layer stack in a second dimension corresponding to the second axis.

10. The magnetoresistive sensor of claim 1, wherein the mechanical stress causes the magnetization axis of the reference layer to shift to be parallel with the mechanical stress axis or perpendicular with the mechanical stress axis such that the fixed reference magnetization is parallel with the mechanical stress axis or perpendicular with the mechanical stress axis, respectively.

11. The magnetoresistive sensor of claim 1, further comprising:
a first conductive layer configured to conduct a current; and
a second conductive layer configured to conduct the current,
wherein the layer stack is arranged between the first conductive layer and the second conductive layer,
wherein the stress inducing layer is arranged between the first conductive layer and the layer stack.

12. The magnetoresistive sensor of claim 11, further comprising:
a second stress inducing layer is arranged between the second conductive layer and the layer stack,
wherein the second stress inducing layer is configured to induce a second mechanical stress in the layer stack along the mechanical stress axis such that the magnetization axis is aligned parallel with the mechanical stress axis or perpendicular with the mechanical stress axis.

13. The magnetoresistive sensor of claim 11, wherein the layer stack is stacked in a vertical dimension,
wherein the layer stack is arranged between the first conductive layer and the second conductive layer in the vertical dimension, and
wherein the stress inducing layer is arranged between the first conductive layer and the layer stack in the vertical dimension.

14. The magnetoresistive sensor of claim 1, wherein the layer stack comprises a reference layer system comprising:
a pinned layer having a pinned magnetization via coupling to an antiferromagnet;
the reference layer having the fixed reference magnetization that is oriented anti-parallel to the pinned magnetization; and
a coupling interlayer arranged between the pinned layer and the reference layer and configured to couple the fixed reference magnetization to be anti-parallel to the pinned magnetization, wherein the stress inducing layer is configured to apply the force to the layer stack along the mechanical stress axis such that the pinned magnetization is aligned with the mechanical stress axis or perpendicular with the mechanical stress axis.

15. The magnetoresistive sensor of claim 14, wherein the stress inducing layer is configured to apply the force to the layer stack to induce an elongation of the layer stack in parallel with the mechanical stress axis.

16. The magnetoresistive sensor of claim 1,
wherein the stress inducing layer is configured to induce the reference layer to elongate by a first percentage in a first dimension corresponding to the first axis and induce the reference layer to elongate by a second percentage in a second dimension corresponding to the second axis, and
wherein the first percentage is at least twice as much as the second percentage, to increase an anisotropy of the fixed reference magnetization.

17. The magnetoresistive sensor of claim 16, wherein the first percentage is at least four times as much as the second percentage.

18. A magnetoresistive sensor, comprising:
a sensing element having a layer stack, the layer stack comprising:
a reference layer having a fixed reference magnetization aligned with a magnetization axis;
a magnetic free layer having a magnetically free magnetization, wherein the magnetically free magnetization is variable in a presence of an external magnetic field; and
a non-magnetic layer arranged between the reference layer and the magnetic free layer; and
a stress inducing layer coupled to the layer stack, wherein the stress inducing layer is configured to apply a force to the layer stack to induce a mechanical stress in the layer stack along a mechanical stress axis such that the magnetization axis is aligned parallel with the mechanical stress axis or perpendicular with the mechanical stress axis,
wherein the stress inducing layer has a width dimension of 1-3 micrometers (μm) defined by a first lateral edge and a second lateral edge and a length dimension defined by a third lateral edge and a fourth lateral edge,
wherein the layer stack is arranged between the first lateral edge and the second lateral edge and the layer stack is arranged between the third lateral edge and the fourth lateral edge,
wherein the layer stack has an outer periphery having first distances that are no more than 2 μm from the first lateral edge and the second lateral edge, respectively, and second distances that are greater than 2 μm from the third lateral edge and the fourth lateral edge, respectively, and
wherein a minimum distance of the second distances is at least two times greater than a maximum distance of the first distances.

19. The magnetoresistive sensor of claim 1, wherein the mechanical stress increases a magnetoresistive effect of the sensing element.

20. A magnetoresistive sensor, comprising:
a first sensing element having a first layer stack, the first layer stack comprising:
a first reference layer having a first fixed reference magnetization aligned with a first magnetization axis;
a first magnetic free layer having a first magnetically free magnetization, wherein the first magnetically free magnetization is variable in a presence of an external magnetic field; and
a first non-magnetic layer arranged between the first reference layer and the first magnetic free layer,
wherein the first sensing element comprises a first sensor plane defined by a first axis and a second axis, and
wherein layers of the first layer stack are stacked along a first perpendicular axis perpendicular to the first sensor plane;
a second sensing element having a second layer stack, the second layer stack comprising:
a second reference layer having a second fixed reference magnetization aligned with a second magnetization axis;
a second magnetic free layer having a second magnetically free magnetization, wherein the second magnetically free magnetization is variable in a presence of the external magnetic field; and
a second non-magnetic layer arranged between the second reference layer and the second magnetic free layer,
wherein the second sensing element comprises a second sensor plane defined by the first axis and the second axis, and
wherein layers of the second layer stack are stacked along a second perpendicular axis perpendicular to the second sensor plane; and
a stress inducing layer coupled to the first layer stack and the second layer stack, wherein the stress inducing layer is configured to apply a first force to the first layer stack to induce a first mechanical stress in the first layer stack along a first mechanical stress axis such that the first magnetization axis is aligned parallel with the first mechanical stress axis or perpendicular with the first mechanical stress axis, and apply a second force to the second layer stack to induce a second mechanical stress in the second layer stack along a second mechanical stress axis such that the second magnetization axis is aligned parallel with the second mechanical stress axis or perpendicular with the second mechanical stress axis,
wherein the first mechanical stress axis is parallel to the first axis,
wherein the second mechanical stress axis is parallel to the first axis,
wherein the stress inducing layer is configured to induce the first reference layer to elongate by a first percentage in a dimension corresponding to the first axis and induce the first reference layer to elongate by a second percentage in a dimension corresponding to the second axis,
wherein the first percentage is at least twice as much as the second percentage, to increase an anisotropy of the first fixed reference magnetization,
wherein the stress inducing layer is configured to induce the second reference layer to elongate by a third percentage in a dimension corresponding to the first axis and induce the second reference layer to elongate by a fourth percentage in a dimension corresponding to the second axis, and
wherein the third percentage is at least twice as much as the fourth percentage, to increase an anisotropy of the second fixed reference magnetization.

21. The magnetoresistive sensor of claim 20, wherein the first mechanical stress axis is parallel with the second magnetization axis.

22. The magnetoresistive sensor of claim 20, wherein the first force is a first compression force that induces a first tensile stress in the first reference layer in parallel with the first mechanical stress axis and causes the first magnetization axis to align parallel with the first mechanical stress axis or perpendicular with the first mechanical stress axis, and
wherein the second force is a second compression force that induces a second tensile stress in the second reference layer in parallel with the second mechanical stress axis and causes the second magnetization axis to align parallel with the second mechanical stress axis or perpendicular with the second mechanical stress axis.

23. The magnetoresistive sensor of claim 20, wherein the stress inducing layer is a straight structure having a first dimension that extends in a first direction and a second dimension that extends in a second direction perpendicular to the first direction,
wherein the first dimension is smaller than the second dimension and the first dimension undergoes a bending stress resulting in the first force applied to the first layer stack and the second force applied to the second layer stack,
wherein the first sensing element and the second sensing element are spaced apart in the second direction, and
wherein the first direction is parallel to the first mechanical stress axis and the second mechanical stress axis.

24. The magnetoresistive sensor of claim 20, wherein the stress inducing layer is a single, continuous layer.

25. The magnetoresistive sensor of claim 20, wherein the stress inducing layer is a U-shaped structure having a first segment coupled to the first layer stack, a second segment coupled to the second layer stack, and a third segment coupled to and extending between the first segment and the second segment in a lateral direction,
wherein the lateral direction is parallel to the first mechanical stress axis and the second mechanical stress axis,
wherein the first segment is configured to apply the first force to the first layer stack, inducing the first mechanical stress along the first mechanical stress axis, and
wherein the second segment is configured to apply the second force to the second layer stack, inducing the second mechanical stress along the second mechanical stress axis.

26. The magnetoresistive sensor of claim 25, wherein the first sensing element and the second sensing element comprise a sensor plane defined by a first axis and a second axis,
wherein layers of the first layer stack and the second layer stack are stacked along a third axis perpendicular to the sensor plane, and
wherein the first segment, the second segment, and the third segment extend in respective lateral directions such that a U-shape of the stress inducing layer is defined in a lateral plane comprising the respective lateral directions, the lateral plane being parallel to the sensor plane.

27. A magnetoresistive sensor, comprising:
a sensing element having a layer stack stacked in a vertical dimension, the layer stack comprising:
a reference layer having a fixed reference magnetization aligned with a magnetization axis;
a magnetic free layer having a magnetically free magnetization, wherein the magnetically free magnetization is variable in a presence of an external magnetic field; and
a non-magnetic layer arranged between the reference layer and the magnetic free layer; and
a conductive layer coupled to a top or a bottom of the layer stack, wherein the conductive layer has a first outer periphery that defines lateral edges of the conductive layer,
wherein the layer stack has a second outer periphery that defines lateral edges of the layer stack, wherein a minimum distance between the first outer periphery and the second outer periphery is greater than 1 micrometer ($\mu m$).

28. The magnetoresistive sensor of claim 27, wherein a preferred magnetic anisotropy of the fixed reference magnetization is substantially unaffected by the conductive layer.

* * * * *